United States Patent [19]

Kino et al.

[11] Patent Number: 4,458,328
[45] Date of Patent: Jul. 3, 1984

[54] ADAPTIVE FILTER USING AN ASW STORAGE CORRELATOR

[75] Inventors: Gordon S. Kino, Stanford, Calif.; David Behar, Kiriat Bialik, Israel; John E. Bowers, Mountain View, Calif.; Hermund Alaisen, Flatehy, Norway

[73] Assignee: The United States of America as represented by the Secretary of the Navy, Washington, D.C.

[21] Appl. No.: 234,526

[22] Filed: Feb. 13, 1981

[51] Int. Cl.³ .................... G06G 7/122; G06G 7/19; H03H 21/00

[52] U.S. Cl. .................... 364/825; 333/150; 364/821; 364/861; 375/14

[58] Field of Search ............. 364/821, 825; 333/150; 28/167; 375/14

[56] References Cited

U.S. PATENT DOCUMENTS

| | | | |
|---|---|---|---|
| 4,075,706 | 2/1978 | Stern et al. | 364/821 |
| 4,101,965 | 7/1978 | Ingebrigtsen et al. | 364/821 |
| 4,124,828 | 11/1978 | Bert | 364/821 X |
| 4,247,903 | 1/1981 | Grudkowski et al. | 364/821 |
| 4,333,158 | 6/1982 | Voorman | 364/825 |

*Primary Examiner*—Felix D. Gruber
*Attorney, Agent, or Firm*—R. S. Sciascia; Charles D. B. Curry; William C. Daubenspeck

[57] ABSTRACT

An analog adaptive filter for deconvolving distorted signals. A clipped version of the least mean square algorithm is implemented in a first embodiment by placing an acoustic surface wave storage correlator in a feedback loop and performing an iterative two step process to adjust the weight function of the correlator to make the output of the filter converge to a desired signal. In the first step, the distorted signal is applied to the top plate port of the storage correlator and the filter output from the acoustic port is delayed and subtracted from a training signal to produce an error signal. In the second step, the error signal is applied to the top plate port and the distorted signal is applied to the acoustic port which results in the correlation of the acoustic signal and the plate signal being added to the weight function stored in the storage correlator. The two step process is repeated until the filter output from the plate port converges to an approximation of the training signal. The filter may then be used to deconvolve other signals which have undergone a similar distortion. In a second embodiment which does not require switching, the error signal is coupled to the second acoustic port to provide the feedback signal. In a third embodiment, the filter is used as an interference canceller.

4 Claims, 9 Drawing Figures

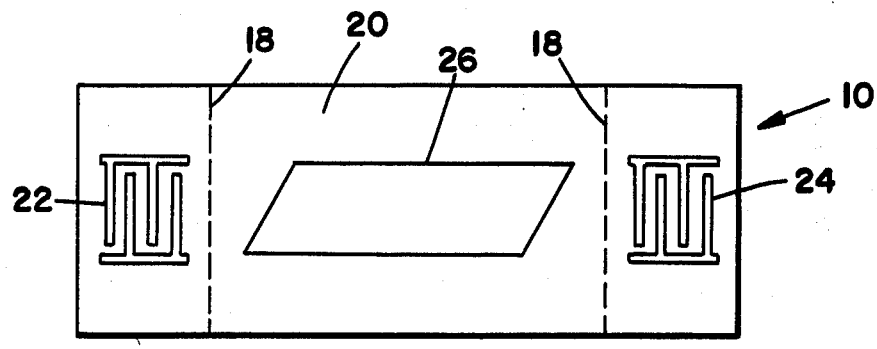
FIG_1A
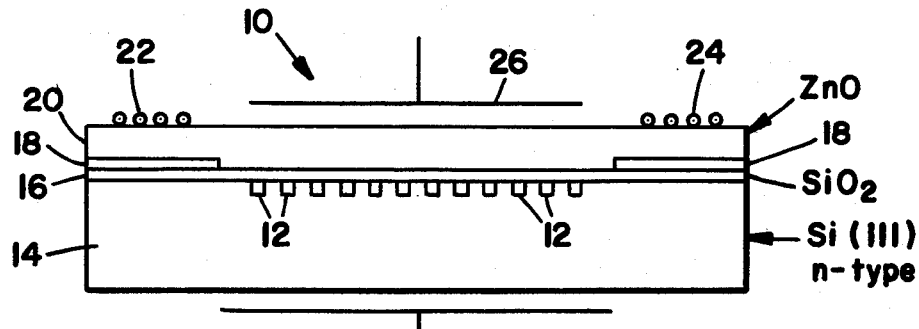
FIG_1B
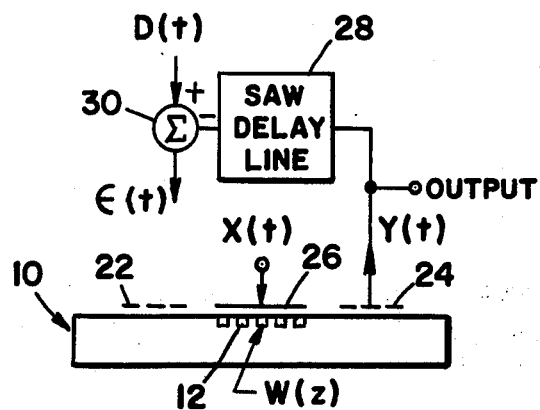
FIG_2A
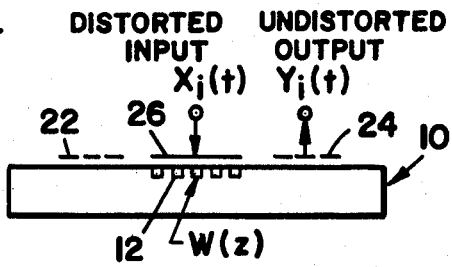
FIG_2C
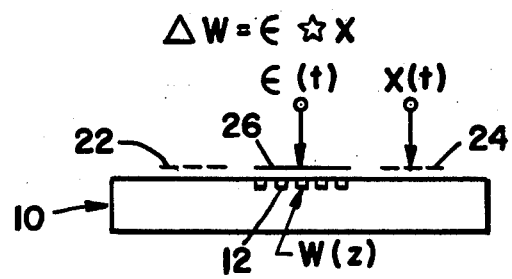
FIG_2B

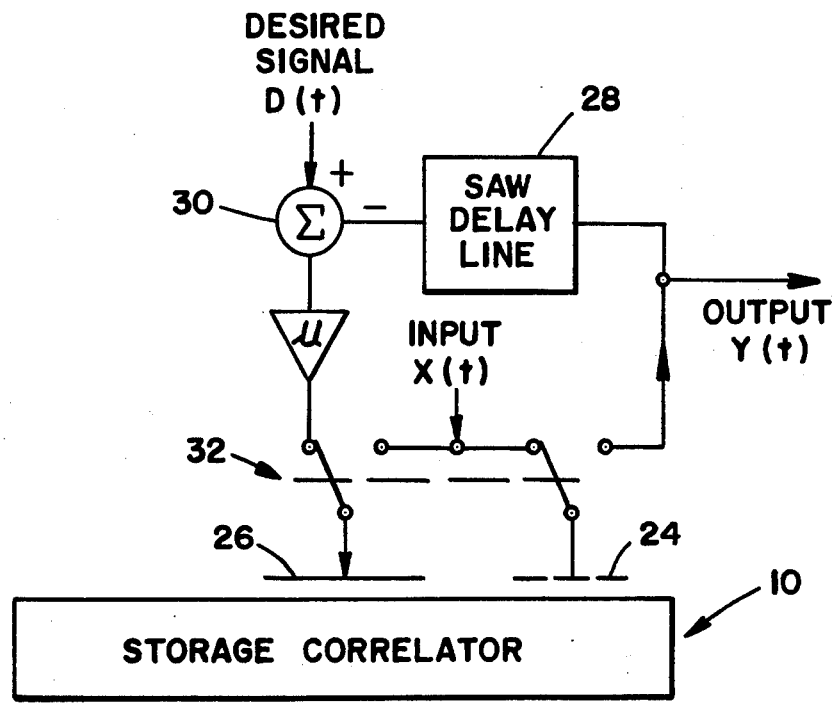
FIG_3A
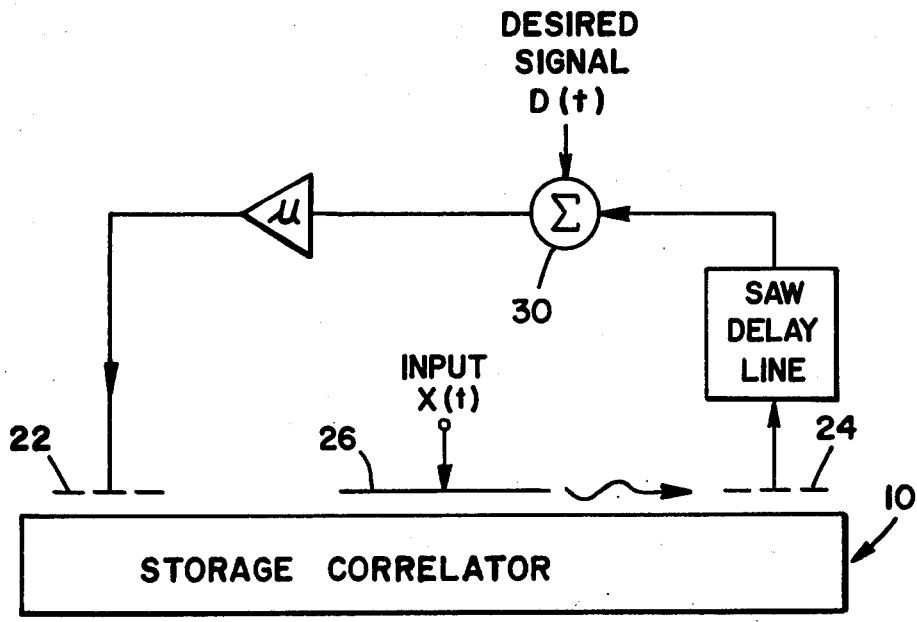
FIG_3B

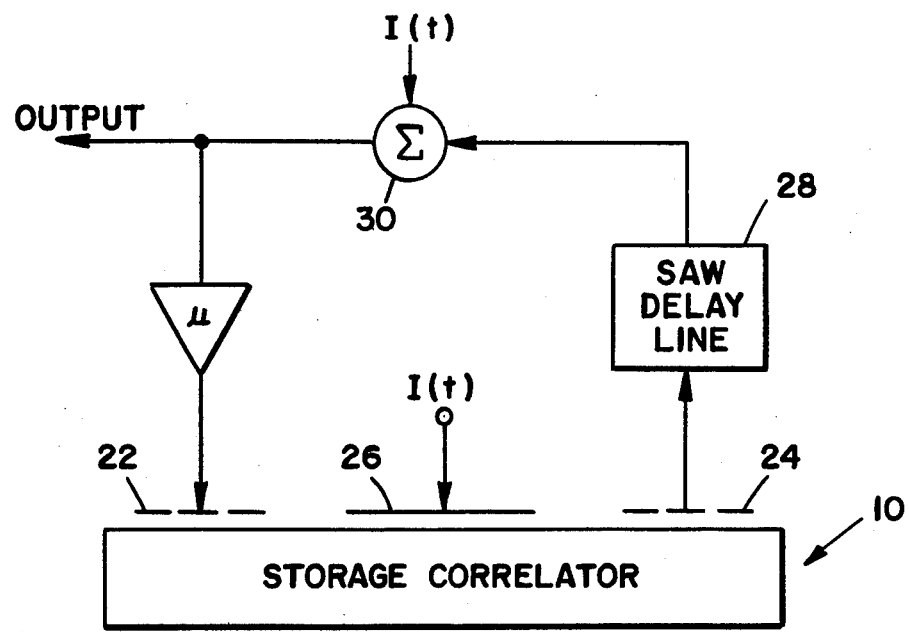
FIG_4A
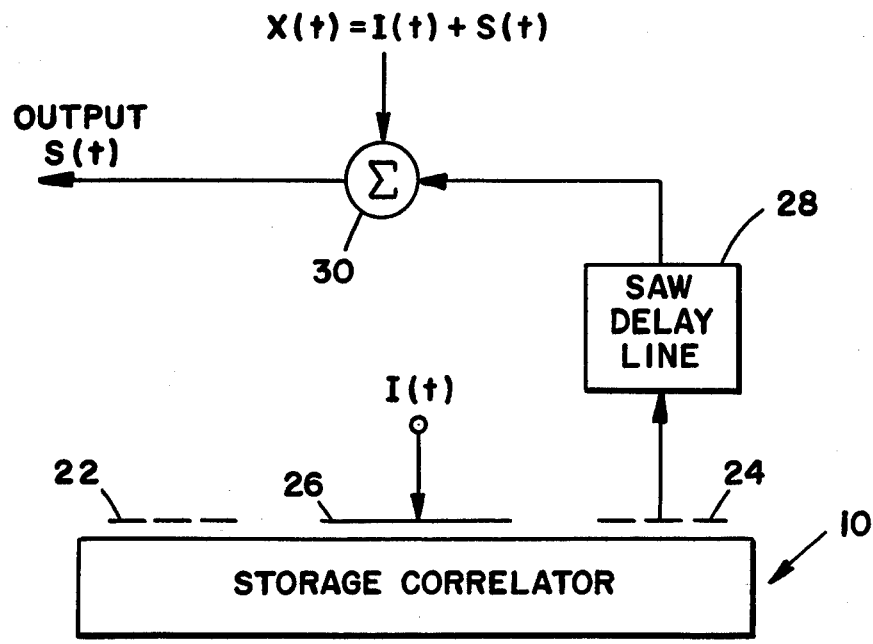
FIG_4B

ADAPTIVE FILTER USING AN ASW STORAGE CORRELATOR

BACKGROUND OF THE INVENTION

1. Field of the Invention. The invention relates in general to adaptive filtering techniques and, in particular, to an analog adaptive filter using an acoustic surface wave (ASW) storage correlator.

2. Description of Prior Art. Adaptive filtering (J. M. McCool and B. Widrow, "Principles and Applications of Adaptive Filters," IEE Conf. Publ., 144, pp. 84-95, 1976) is useful in removing distortion from signals, particularly when the distortion varies in time. Adaptive filters have been used to perform deconvolution of a distorted echo pulse in an acoustic imaging system (D. Corl, "A.C.T.D. Adaptive Inverse Filter," Electr. Lett., 14. pp. 60-62, 1978), to equalize the distortion in a telephone channel (R. W. Lucky, "Automatic Equalization for Digital Communications," Bell Sys. Tech. J., 66, pp. 547-588, 1965), and to suppress an interfering signal (P. M. Grant and G. S. Kino, "Adaptive Filter Based on SAW Monolithic Storage Correlators," Electr. Lett., 14, pp/ 562-564, 1978).

Most adaptive filters have been implemented using digital techniques. The limitations of the digital approach are the limited bandwidth (typically 10 MHz) and the practical limit on the number of taps dictated by the complexity and power consumption of systems with large numbers.

An analog-digital hybrid approach has been implemented using MOS LSI technology (B. K. Ahuja, et al., "A Sampled Analog MOS LSI Adaptive Filter," IEEE J. Solid-State Cir., Sc-14, pp. 148-154, 1979). This has the advantage of lowering the power consumption and allowing 32 taps to be used without undue external complexity. Large dynamic range was obtained with this technique (60 dB), but the bandwidth was limited to less than 1 MHz.

Most analog implementations of an adaptive filter have been made using charge coupled devices with analog tap weights held in sample and hold circuits (D. F. Barbe, et al., "Signal Processing with Charge Coupled Devices," IEEE J. Solid-State Cir., Sc-13, pp. 34-51, 1978). The limitations here are the narrow bandwidth and variation across the chip in the gain and threshold levels. An alternative approach for implementing a wideband adaptive filter is to employ tapped ASW filters with complex computer-controlled systems for adjusting the tap weights (W. K. Masenten, "Adaptive Processing for Spread Spectrum Communications Systems," Report TP 77-14-22. Hughes Aircraft Co., September 1977).

SUMMARY OF THE INVENTION

The present invention is an adaptive inverse filter which makes use of the capability of the ASW storage correlator, combining its ability to perform complex mathematical operations, such as convolution and cross-correlation in real time, with its inherent property of storing and adding signals iteratively. The present invention provides a relatively simple all-analog approach to adaptive filtering using the LMS algorithm to find the optimal set of tap weights. Among the advantages provided by the present invention and, in particular, by the ASW monolithic ZnO/Si storage correlator implemented according to the present invention are:

(1) fast iteration rate (100 kHz), which means a short learning time ($\sim 100$ $\mu$sec) and good ability to track time varying signals;
(2) simple external connections;
(3) large potential bandwidth (100 MHz);
(4) large potential number of taps (1000);
(5) low power consumption (0.1 W); and
(6) it is suited for radar and communications systems because it can operate directly at the IF frequency.

According to a first embodiment of the present invention, the least mean square (LMS) algorithm is implemented by placing an ASW storage correlator in a feedback loop and performing a two step iterative process to make the output of the filter converge to a desired signal. In the first step, the distorted signal is applied to the top plate port of the storage correlator and the output from an acoustic port (which is the convolution of the distorted signal and the weight function stored in the correlator) is delayed and subtracted from a training signal (i.e., desired signal) to produce an error signal. In the second step, the error signal is applied to the top plate port and the distorted signal is applied to the acoustic port which results in the correlation of the acoustic signal and the plate signal being added to the weight function stored in the storage correlator. This two step process is repeated until the filter output converges to an approximation to the training signal. The filter then may be used to deconvolve other signals which have undergone a similar distortion.

In a second embodiment, the distorted signal is applied to the top plate port of an ASW storage correlator and the delayed output signal from a first acoustic port is subtracted from a training signal to produce an error signal. The error signal is applied to the second acoustic port of the storage correlator. If the carrier frequency is adjusted to provide a phase difference of $\pi$ between carrier of the delayed acoustic output signal and the training signal, the output signal from the first acoustic port converges to an approximation of the desired signal.

A third embodiment discloses an interference canceller in which an interfering signal is applied as both the input signal to the top plate port of the storage correlator and as the training signal. After the error between the delayed output signal from acoustic port and the interfering signal is driven to zero, the feedback loop is broken and the signal to be filtered, which contains the interference and the desired filter output, is applied as the training signal. The difference between the delayed output signal from the acoustic port and training signal is the desired filter output.

Other advantages and features of the present invention will become apparent from the following detailed description of the invention when considered in conjunction with the accompanying drawing wherein like reference characters designate like or corresponding parts.

BRIEF DESCRIPTION OF THE DRAWING

FIGS. 1a and 1b are schematic views illustrating a typical monolithic ASW storage correlator.

FIGS. 2a, 2b and 2c are schematic drawings illustrating the operation of the ASW storage correlator as an adaptive inverse filter.

FIGS. 3a and 3b are schematic drawings illustrating two embodiments implementing ASW adaptive filters according to the present invention.

FIGS. 4a and 4b are schematic drawings illustrating a third embodiment implementing an ASW adaptive filter according to the present invention.

DESCRIPTION OF THE PREFERRED EMBODIMENT

Referring now to FIGS. 1a and 1b, there is shown a schematic drawing of a typical monolithic ASW storage correlator 10. A row of diodes 12 with a periodic spacing is laid down on a silicon substrate 14. Thus, the diodes 12 can sample an acoustic wave passing over the surface of the substrate 14. A thermal oxide layer 16 ($SiO_2$) is grown on top of the silicon substrate 14 and gold pads 18 are disposed at each end of the oxide layer. A piezoelectric zinc oxide layer 20 is sputter deposited on top of the thermal oxide layer 16. Finally, interdigital transducers 22 and 24 and a metal electrode 26 are laid down on the zinc oxide layer 20 to provide a first acoustic port, a second acoustic port and a plate port, respectively. The piezoelectric zinc oxide layer 20 makes it possible for the acoustic surface wave propagating along the silicon layer 14 to produce an electric field which couples to the diodes 12. The diodes 12 act as individual sample-and-hold devices and can store the signal for as long as one second. Both p-n diodes and Schottky diodes have been used in this type of device. Complete descriptions of the storage correlator are found in the literature (K. A. Ingebritsen, et al., "A Schottky Diode Acoustic Memory and Correlator," Appl. Phys., Lett., 26, pp. 596-598, 1975. C. Maerfeld and P. Defranould, "A Surface Wave Memory Device Using pn Diodes," IEEE Ultrasonics Symp. Proc., pp. 209-211, 1975. H. C. Tuan, et al., "A New Zinc Oxide on Silicon Monolithic Storage Correlator," IEEE Ultrasonics Symp. Proc., 496-499, 1977. H. C. Tuan, J. E. Bowers, and G. S. Kino, "Theoretical and Experimental Results for Monolithic SAW Memory Correlators," submitted to IEEE Trans. Sonics and Ultrasonics, June, 1980).

Turning now to the LSM adaptive algorithm (devised by B. Widrow and M. E. Hoff, Jr.) implemented by the present invention, consider an adaptive filter with an input $X(t)$ and output $Y(t)=X*W$ where $*$ indicates convolution. The tap weights W are adjusted after each iteration such that the output $Y(t)$ converges to a desired signal (training signal) $D(t)$. The time it takes for convergence to occur is commonly called the learning or training time. After the optimum weighting $W(t)$ is determined, the filter can be used to remove the distortion in the signals passing through it. For example, in a TV system with a ghost present, the filter can be trained on the sync signal (which occurs at the end of each line) to remove the echo sync signal, and then the entire TV line can be passed through the filter, and the "ghosts" will be removed.

The error $\epsilon(t)$ between the training signal $D(t)$ and the output of the filter $Y(t)$ is $$\epsilon(t) = D(t) - Y(t) \qquad (1)$$

where $$Y = X*W. \qquad (2)$$

The LMS algorithm specifies that in order to minimize the error $\epsilon(t)$, W must be changed by $\Delta W$ such that $$\Delta W = 2\mu X \, \epsilon \qquad (3)$$

where ★ indicates correlation and $\mu$ is a constant which determines the rate of convergence of the system.

It follows from Eqs. (1), (2), and (3), after taking Fourier transforms that for any frequency component the change in $\epsilon(\omega)$ is $\Delta\epsilon(\omega)$ where $$\Delta\epsilon(\omega) = -x(\omega)\Delta W(\omega) = -2\mu x(\omega)x^*(\omega)\epsilon(\omega). \qquad (4)$$

where * indicates the complex conjugate.
If the weight W is changed n times, an iteration of $$\epsilon_{n+1}(\omega) - \epsilon_n(\omega) = -2\mu x(\omega)x^*(\omega)\epsilon_n(\omega) \qquad (5)$$

is performed.
This equation may be solved to show that $$\epsilon_n(\omega) = a^n \epsilon_0(\omega) \qquad (6)$$

where $$a = 1 - 2\mu x(\omega)x^*(\omega). \qquad (7)$$

It will be seen that $\epsilon_n(\omega) \to 0$ provided $2\mu x(\omega)x^*(\omega) < 1$.

So if for each iteration, a convolution of $W(t)$ with $X(t)$, and a correlation of $\epsilon(t)$ with $X(t)$ is performed, the weights converge onto an inverse or Wiener filter. The ASW storage correlator is ideally suited to this purpose, as it can perform these operations directly within the device.

FIGS. 2a, 2b and 2c illustrate the implementation of the LMS algorithm with the ASW storage correlator 10. In a first step shown in FIG. 2a, a distorted input signal $X(t)$ is applied to the plate port 26 of the storage correlation 10. The output from the acoustic port 24, which is the convolution of the distorted signal X and the weight function $W(Z)$ stored in the diode array 12, is delayed in SAW delay line 28 and then subtracted in summing circuit 30 from the training signal $D(t)$ to obtain an error signal, $$\epsilon(t) = D(t) - Y(t) = D(t) - X*W.$$

In a second step illustrated in FIG. 2b, the error signal $\epsilon(t)$ is used to adjust the weight function $W(z)$ stored in the diode array 12. The error signal $\epsilon(t)$ is applied to the plate port 26 and the distorted signal is applied to the acoustic port 24 which results in the correlation of the error signal $\epsilon$ with the distorted signal X being added to the weight function ($\Delta W = \epsilon \bigstar X$).

After several iterations of these two operations, the output $Y(t)$ of the acoustic port 24 will have converged to an approximation of the training signal $D(t)$. As shown in FIG. 2c, the storage correlator 10 can then be used as a fixed inverse filter to deconvolve other signals $X_i(t)$ which have undergone distortion similar to that undergone by the input signal $X(t)$. The distorted signal $X_i(t)$ is applied to the plate port 26 to provide an undistorted output signal $Y_i(t)$ at the acoustic port 24.

FIG. 3a shows a first embodiment implementing the ASW filter. In a first position switching means 32 couples the distorted input signal $X(t)$ to the plate port 26 of the storage correlator 10 to perform convolution of $W(t)$ with $X(t)$. At the same time, this convolution which appears at the acoustic output 24 is coupled by switching means 32 through an SAW delay line 28 and subtracted from the desired signal at 30 to form the feedback error signal $\epsilon(t)$. In its second position, the switching means 32 couples the feedback signal $\epsilon(t)$ having a gain μ to the plate port 26 and the distorted input signal to the acoustic port 24 to perform a correlation of ε(t) with X(t). This operation adjusts the weighting function prior to the next iteration.

FIG. 3b shows an alternate embodiment in which all three ports of the storage correlator are used during training and which does not require the switching means 30 of FIG. 3b. In this case, the distorted input signal X(t) is applied to the plate port 26, the output of the acoustic port 24 after being delayed in delay line 28 is subtracted from the training signal D(t), and the feedback error signal ε(t) is coupled to the other acoustic port 22. After the output Y(t) has converged to the training signal D(t), the storage convolver 10 may be used as a fixed inverse filter as shown in FIG. 2c.

FIGS. 4a and 4b show a third embodiment of the present invention in which the ASW storage correlator is implemented as an adaptive interference canceller. FIG. 4a illustrates the training process in which the interfering signal I(t) is applied as an input to both the plate port 26 and the summing circuit 30. The output from the acoustic port 24 is coupled through the ASW delay line 28 to provide the other input to the summing circuit 30. The output ε(t) from the summing circuit 30, which is the canceller output, is coupled to the other acoustic port 22. In operation, the filter is trained on the interference signal I(t) until the output of the summing circuit 30 is driven to zero. Now as shown in FIG. 4b, the training input I(t) to the summing circuit 30 is replaced by the signal to be filtered X(t) which contains the interference I(t) and the desired filter output S(t), and the feedback input to the acoustic port 22 is removed. The filter will now cancel the interfering signal I(t) so that the canceller output from the summing circuit 30 will be the desired signal S(t). It should be obvious that the configuration of FIG. 3a can also be used to implement an adaptive interference canceller.

The present adaptive filter does not operate in exactly the same manner given by Eq. (4) because the effect of the plate signal on the tap weights is not linear. If the error signal is less than a certain threshold the tap weights are unaffected. Furthermore the error signal is clipped so only a limited dynamic range is available at the top plate. If the error signal is fed into an acoustic port (as in FIG. 3b), then a much larger dynamic range should be available after the device has set itself. It is also noted that phase distortion in the system is cancelled out by the application of the convolution and correlation process in turn. Thus, although this basically a feedback system, there is no problem with instability, provided the convergence criteria are satisfied.

Experiments were carried out with a ZnO on Si pn diode correlator, similar to that described previously. This device had 10 finger pair transducers with an 8 MHz bandwidth, a top plate 3 μsec long (1 cm) and operated at a center frequency of 125 MHz. In one experiment, a square pulse 0.4 μs long was followed by an echo pulse. For an echo which was 6 dB less in amplitude than the main pulse, the sidelobe suppression after 22 iterations (450 μs) was 15 dB. It is noted that clipping of the signal increases the rate of convergence radically, as has been noted by others. The algorithm employed is therefore known as the clipped LMS algorithm.

An important result obtained in this experiment is that spurious acoustic signals generated by the plate readout signal can be suppressed as a result of the adapting process. The filter does not distinguish between echoes and distortions generated externally or by the device itself. Regardless of the shape of the training signal D(t) and input signal X(t), it was always experimentally observed that the feedback gain must be large enough to strongly clip the error signal during the first few iterations for the optimum filtering. After many iterations, the error signal is only slightly clipped.

What is claimed is:

1. An adaptive inverse filter comprising:
    (a) an acoustic surface wave storage correlator having a plate port and at least one acoustic port;
    (b) a delay line having an input and an output;
    (c) switching means having two states, the first state coupling an input signal to be filtered to the plate port and the filter output signal from the acoustic port to the input of said delay line, said output signal being the convolution of the input signal and the weight function stored at that time in the storage correlator, the second state coupling an error signal to the plate port and the input signal to the acoustic port whereby the correlation of the input signal and the error signal is added to the weight function stored at that time in the storage correlation; and
    (d) means for subtracting the output of said delay line from a training signal to provide said error signal, whereby the switching means may be iteratively switched between the two states to cause the filter output from the acoustic port to converge to an approximation of the training signal, the weight function of the storage correlator thereby being adjusted so that a second signal having undergone a distortion similar to the distortion undergone by the input signal may be applied to the plate port and an undistorted signal provided at the acoustic port.

2. An adaptive canceller for removing an interfering signal from an input signal containing a desired signal and an interfering signal comprising:
    (a) an acoustic surface wave storage correlator having a plate port and at least one acoustic port;
    (b) a delay line having an input and an output;
    (c) switching means having two states, the first state coupling the interfering signal to the plate port and the output signal from the acoustic port to the input of said delay line, said output signal being the convolution of the interfering signal and weight function stored at that time in the storage correlator, the second state coupling an error signal to the plate port and the interfering signal to the acoustic port whereby the correlation of the interfering signal and the error signal is added to the weight function stored at that time in the storage correlator; and
    (c) means for subtracting the output of said delay line from the interfering signal to provide said error signal, whereby the switching means may be iteratively switched between the two states to cause the output from the acoustic port to converge to an approximation of the interfering signal and the error signal to converge to approximately zero, the weight function of the storage correlator thereby being adjusted so that if the switching means is in the first state, the input signal may be subtracted from the output of the delay line to provide the desired signal.

3. An adaptive canceller for removing an interfering signal from an input signal containing a desired signal and an interfering signal comprising:
  (a) an acoustic surface wave storage correlator having a plate port, a first acoustic port, and a second acoustic port, said storage correlator receiving the interfering signal on the plate port and providing an output signal at said first acoustic port, said output signal being the convolution of the interfering signal and the weight function stored at that time in said storage correlator; and
  (b) delay means having an input and an output, the input of said delay means coupled to said first acoustic port;
  (c) means for subtracting the output of said delay means from said interfering signal to provide an error signal, said error signal being coupled to the second acoustic port whereby the correlation of the interfering signal and the error signal is added to the weight function stored at that time in the storage correlator, the weight vector thereby being adjusted so that the output of said first acoustic port converges to an approximation of said interfering signal and the error signal converges to approximately zero, the weight function of the storage correlator thereby being adjusted so that if the error signal is uncoupled from said second acoustic port, the input signal may be subtracted from the output of the delay means to provide the desired signal.

4. An adaptive inverse filter comprising:
  (a) an acoustic surface wave storage correlator having a plate port, a first acoustic port, and a second acoustic port, said storage correlator receiving an input signal to be filtered on the plate port and providing an output signal at said first acoustic port, said output signal being the convolution of the input signal and the weight function stored at that time in said storage correlator;
  (b) delay means having an input and an output, the input of said delay means being coupled to said first acoustic port; and
  (c) means coupled to the output of said delay means for subtracting the output of said first acoustic port from a training signal to provide an error signal, said error signal being coupled to the second acoustic port whereby the correlation of the input signal and the error signal is added to the weight function stored at that time in the storage correlator, the weight function thereby being adjusted so that the output of said first acoustic port converges to an approximation of said training signal, whereby the error signal may be uncoupled from said second acoustic port and a second signal having undergone a distortion similar to the distortion undergone by the input signal may be applied to the plate port to provide an undistorted signal at the first acoustic port.

* * * * *